Nov. 17, 1964 AKIRA KAWAJI 3,157,833

TRANSISTOR AMPLIFIER ENCLOSED IN AN ATMOSPHERE OF CAMPHOR NAPHTHALENE OR COMBINATION THEREOF

Filed June 5, 1962

INVENTOR
AKIRA KAWAJI
BY
ATTORNEY

United States Patent Office 3,157,833
Patented Nov. 17, 1964

3,157,833

TRANSISTOR AMPLIFIER ENCLOSED IN AN ATMOSPHERE OF CAMPHOR NAPHTHALENE OR COMBINATION THEREOF

Akira Kawaji, Tokyo, Japan, assignor to Nippon Electric Company Limited, Tokyo, Japan, a corporation of Japan Filed June 5, 1962, Ser. No. 200,085
3 Claims. (Cl. 317—234)

Figure 3:
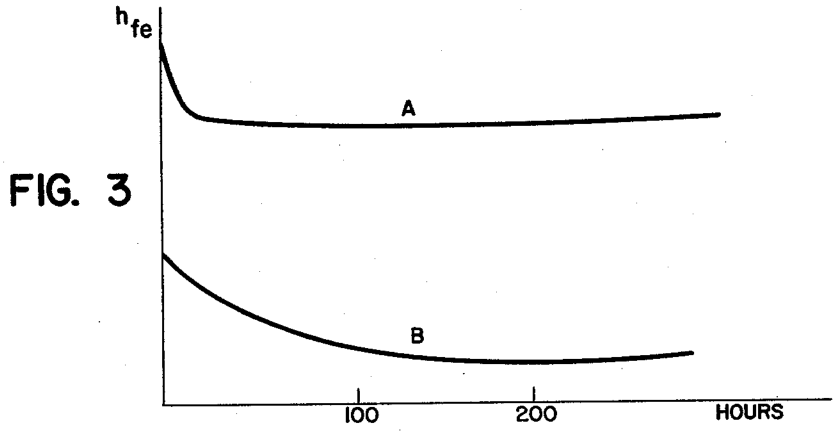

This invention relates to improvements in transistors, and particularly to transistors which are enclosed in a controlled atmosphere and to an improved method for making them.

In the manufacture of transistors it has been found that the presence of moisture or water vapor in the atmosphere of the transistor enclosure produces a deleterious effect upon the transistor characteristics. In order to prevent this phenomenon, different approaches were tried to remove the water content from the atmosphere surrounding the transistor semiconductor element, such as evacuating the atmosphere or charging the atmosphere with a drying gas. These attempts to solve the problem were not entirely satisfactory, however, because substantially complete removal of the moisture resulted in a considerable decrease in the current amplification factor characteristic of the transistor.

A further attempt to solve the problem was sought by limiting the amount of the drying agent introduced into the enclosure to thereby allow a suitable amount of moisture to remain in the enclosure. While this latter approach allowed improved current amplification over that obtained by removing all of the moisture, it was found that the life of the transistor was substantially reduced and gave rise to large variations in the characteristics. Further, it is very difficult to control the process so that just the proper amount of moisture remains to achieve the highest amplification factor. As a practical matter then, it appeared impossible to manufacture a transistor having the desired high degree of current amplification while at the same time having a long life.

Accordingly, it is an object of this invention to make available transistors of higher quality than were heretofore available characterized in that they have a higher degree of amplification without reduced life.

Figure 1:
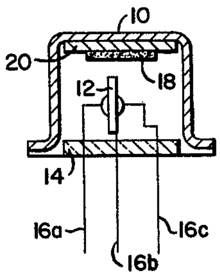
Figure 2:
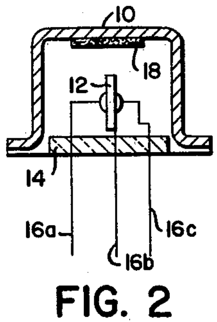
Figure 4:
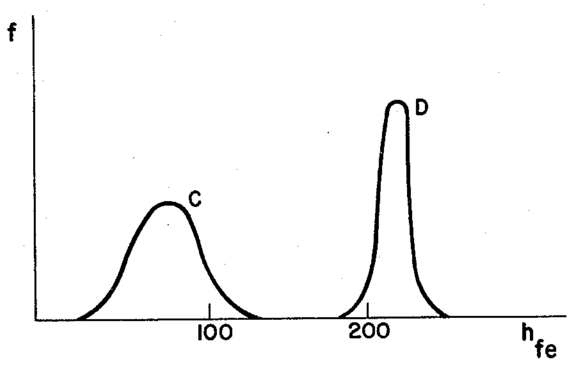

These and other objects, features and advantages of the invention will become apparent to those skilled in the art from the following description taken in conjunction with the claims and the drawing in which:

FIGS. 1 and 2 are cross-sectional views of transistors made in accordance with the invention;

FIG. 3 is a graph showing the decrease in current amplification with thermal aging of a transistor made in the conventional manner and of a transistor made in accordance with this invention, and FIG. 4 is a distribution curve showing the composite current amplification characteristic of a large number of representative transistors made in mass-production by a conventional method and by the method of this invention.

In accordance with the principles of the invention, a dry atmosphere is provided around the transistor and this atmosphere is charged with a material capable of improving the current amplification or amplification factor while at the same time having no detrimental effect upon the useful life span of the semiconductor element.

Referring now to FIG. 1, there is shown a transistor enclosure 10 having a semiconductor element 12 of for example, the germanium PNP type mounted on a suitable header 14. The header 14 is sealed to the enclosure 10 and wires 16*a*, 16*b* and 16*c* are connected to the semiconductor element and extend through the header.

A predetermined amount of a suitable charging material 18 such as, for example, camphor, is provided within the enclosure 10 along with a suitable drying agent 20 such as, for example, activated alumina. These materials 18 and 20 may be held in adhesive contact with each other and with the internal surface of the enclosure 18 by means of any suitable adhesive such as, for example, silicon grease. These materials need not necessarily be in solid block form as shown, but can also be in granular form. Also, camphor in powdered form could be intermixed in strip 20 if desired. For an enclosure 10 of conventional size, approximately 1 to 5 milligrams of high purity camphor have been found to produce very good results. Satisfactory results have also been achieved by using a charging material of naphthalene and combinations of camphor and naphthalene, both in solid and in granulated form. When the charging material is sealed in the enclosure, it sublimes to the gaseous state to thereby charge or saturate the atmosphere surrounding the transistor element 12. The presence of this gas produces the improved amplification factor without reducing the useful life of the transistor.

In FIG. 2 an alternative arrangement is employed in which the drying agent material 20 is eliminated when moisture content within the enclosure is so small that such an agent is not required.

FIG. 3 shows a graph of the manner in which the current amplification ($h_{fe}$) varies with time that the transistor is exposed to a temperature of approximately 100° C. Curve B shows the variation of a transistor when only the drying agent 20 has been employed in the enclosure 10 and curve A shows the effect of using camphor or naphthalene in the enclosure. Comparison of these curves A and B readily illustrates the very great improvement in the value of current amplification which can be achieved by the use of the charging material in accordance with this invention. It also shows that the transistor manufactured in accordance with this invention achieves a stable current amplification value in a very short time compared with that of a transistor manufactured in the conventional manner.

FIG. 4 illustrates distribution curves for a representative large number of transistors manufactured according to the conventional method (curve C) and according to the method of the invention (curve D). The ordinate of the FIG. 4 graph represents piece numbers $f$ and the abscissa represents the current amplification value $h_{fe}$. As can be seen, the transistors manufactured in accordance with the invention fall within a narrower range of $h_{fe}$ values than those manufactured by conventional methods, and accordingly better quality control of those manufactured by the method of the invention is achieved. The graph also shows, as does that of FIG. 3, the great improvement in the value of the current amplification $h_{fe}$ when transistors are manufactured according to the invention. The current amplification of transistors manufactured according to the invention is of the order of 2–3 times higher than those manufactured by conventional methods.

While the foregoing description sets forth the principles of the invention in connection with specific apparatus, it is to be understood that the description is made only by way of example and not as a limitation of the scope of the invention as set forth in the objects thereof and in the accompanying claims.

I claim:

1. In combination, an enclosure, a semiconductor amplifying element mounted within said enclosure and surrounded by an atmosphere, said enclosure being provided with means for making electrical connections between said element and the outside of said enclosure, and a charging material disposed within said enclosure for charging the atmosphere surrounding said element to thereby enhance the amplification factor of said element, said charging material comprising a material selected from the group including camphor, naphthalene and a combination thereof.

2. The invention as recited in claim 1 which further includes means within said enclosure for eliminating moisture in said atmosphere.

3. The invention as recited in claim 2 wherein said means for eliminating moisture comprises a material composed essentially of alumina.

References Cited by the Examiner

UNITED STATES PATENTS

| | | | |
|---|---|---|---|
| 2,900,701 | 8/59 | Coggins | 317–234 |
| 2,998,557 | 8/61 | Van Amstel | 317–234 |

DAVID J. GALVIN, *Primary Examiner.*